United States Patent
Sagawa et al.

(10) Patent No.: US 8,039,760 B2
(45) Date of Patent: Oct. 18, 2011

(54) MOUNTING BOARD AND METHOD OF PRODUCING THE SAME

(75) Inventors: Tomoharu Sagawa, Sakura (JP); Atsushi Kume, Sakura (JP)

(73) Assignee: Fujikura Ltd., Tokyo (JP)

( * ) Notice: Subject to any disclaimer, the term of this patent is extended or adjusted under 35 U.S.C. 154(b) by 0 days.

(21) Appl. No.: 12/822,611

(22) Filed: Jun. 24, 2010

(65) Prior Publication Data

US 2010/0258341 A1  Oct. 14, 2010

Related U.S. Application Data

(63) Continuation of application No. PCT/JP2008/073401, filed on Dec. 24, 2008.

(30) Foreign Application Priority Data

Dec. 26, 2007  (JP) ................................. 2007-334593

(51) Int. Cl.
  *H05K 1/16* (2006.01)
(52) U.S. Cl. .......................... 174/260; 257/787; 361/767
(58) Field of Classification Search .......... 257/787–796; 174/260; 361/767–779, 783
  See application file for complete search history.

(56) References Cited

U.S. PATENT DOCUMENTS

| | | | |
|---|---|---|---|
| 6,011,313 A * | 1/2000 | Shangguan et al. | 257/778 |
| 7,768,140 B2 * | 8/2010 | Oi | 257/790 |
| 2005/0029666 A1 * | 2/2005 | Kurihara et al. | 257/772 |
| 2009/0211796 A1 * | 8/2009 | Chinda et al. | 174/260 |

FOREIGN PATENT DOCUMENTS

| | | |
|---|---|---|
| JP | 4-003490 A | 1/1992 |
| JP | 4-348587 A | 12/1992 |
| JP | 6-069639 A | 3/1994 |
| JP | 9-260822 A | 10/1997 |
| JP | 11-251177 A | 9/1999 |
| JP | 2006-120677 A | 5/2006 |

* cited by examiner

*Primary Examiner* — Jeremy Norris
(74) *Attorney, Agent, or Firm* — Sughrue Mion, PLLC

(57) ABSTRACT

A mounting board of the invention includes: an insulative base; a plurality of first conductive elements provided on the insulative base and having lands; a plurality of second conductive elements disposed on the lands; a plurality of solder pieces each disposed on each of the second conductive elements; and an electronic component which includes electrode sections each contacting each of the solder pieces, wherein the first conductive elements are made from a first element that contains at least silver; the second conductive elements are made from a second element that contains at least copper; and the solder pieces are made from a third element that contains at least tin.

7 Claims, 14 Drawing Sheets

MOUNTING BOARD AND METHOD OF PRODUCING THE SAME

BACKGROUND OF THE INVENTION

1. Field of the Invention

The present invention relates to a mounting board and a method of producing the same. More particularly, the invention relates to a mounting hoard which ensures excellent connection reliability and on which small electronic components can be mounted.

Priority is claimed on Japanese Patent Application No. 2007-334593, filed Dec. 26, 2007, the content of which is incorporated herein by reference.

2. Description of the Related Art

Electronic components have been mounted on a circuit board or other substrate using solder or a conductive adhesive.

An exemplary connection terminal structure is shown in FIG. 12, which is disclosed in Patent Document 1. This connection terminal structure includes a wiring board 101 having a wiring pattern formed thereon. The wiring pattern includes first lands 102. Second lands 103 made from a metallic material with poor solderability are provided on the first lands 102. Third lands 104 made from precious metal material with good solderability are provided on the second lands 103 for soldering. The second lands 103 define a surface to exclude solder pieces 106 at an outer periphery of the third lands 104. Electrode sections 141 of an electronic component 140 and the wiring board 101 are electrically connected together via the solder pieces 106. In this connection terminal structure, the wiring board 101 is made from epoxy resin, ceramic or alumina, and the wiring pattern therefore is a copper circuit. Accordingly, the structure disclosed in Patent Document 1 addresses typical problems relating to soldering on copper wiring, including a problem of separation of lands for soldering (namely, the third land 104) and the solder pieces 106.

In the case in which some electronic components are mounted on a membrane circuit board, the membrane circuit board includes a polyethylene terephthalate (hereinafter referred to as PET) substrate on which a printed silver paste circuit is formed. In mounting the electronic components by soldering, low-temperature solder (with a soldering temperature of about not more than 165° C.) must be used that causes no PET embrittlement.

Accordingly, for the mounting on the membrane circuit board, a conductive adhesive which starts a curing reaction at a relatively low temperature (i.e., about not more than 165° C.) is used instead of solder. FIG. 13A is a cross-sectional view schematically showing an exemplary mounting board in which an electronic component is mounted on a membrane circuit board using a conductive adhesive. A conductive paste circuit 220 provided on a substrate 210 is electrically connected to electrode sections 241 of an electronic component 240 via conductive adhesive pieces 260(260a). Outer peripheral areas of the conductive adhesives 260a are sealed with sealing resin 261 adhering thereto.

In this case, adhesive strength between the electronic component 240 and the substrate 210 is determined by epoxy resin contained in the conductive adhesive pieces 260 or by the sealing resin 261. Unlike connection by soldering, no metal connection is established in the mounting board of FIG. 13A, a connection state is therefore unstable that can cause poor conductivity.

Recently, more and more tin-plated electrode sections such as the electrode sections 241 of the electronic component 240 are used along with gold-plated electrode sections. The conductive adhesive pieces 260 typically include silver powder and epoxy resin as principal components. The silver component in the conductive adhesive pieces 260 is incompatible with the tin component and they may cause galvanic corrosion. In addition, moisture ingression into an epoxy resin component at an interface of the conductive adhesive pieces 260 and the connecting sections of the electrode sections 241 may cause local cell corrosion (i.e., galvanic corrosion). As a result, tin may be dissolved or oxidized to cause poor connectivity. In order to prevent this phenomenon, a binder with reduced hygroscopicity should be employed to inhibit moisture ingression.

The conductive adhesive pieces 260a may be deformed and extended during mounting of the electronic component 240. In a subsequent heating process, the conductive adhesive pieces 260a may lose viscosity and then flow out of the applied place. As a result, two conductive adhesive pieces 260a are flown into space 250 to unite together as shown in FIG. 13B. To prevent occurrence of such a phenomenon, the distance between the two conductive adhesive pieces 260a should be increased to some extent. It is therefore difficult to mount small electronic components on the conventional mounting board.

[Patent Document 1] Japanese Unexamined Patent Application, First Publication No. 2006-120677

The invention has been made in view of the aforementioned circumstances, and an object thereof is to provide a mounting board which ensures excellent connection reliability and on which small electronic components can be mounted.

Another object of the invention is to provide a method of producing a mounting board on which tin-plated small electronic components can be mounted with improved yields of products.

SUMMARY OF THE INVENTION

The followings are employed to solve the aforementioned problems and to achieve the objects.

(1) A mounting board according to an aspect of the invention includes: an insulative base; a plurality of first conductive elements provided on the insulative base and having lands; a plurality of second conductive elements disposed on the lands; a plurality of solder pieces each disposed on each of the second conductive elements; and an electronic component which includes electrode sections each contacting each of the solder pieces, wherein the first conductive elements are made from a first element that contains at least silver; the second conductive elements are made from a second element that contains at least copper; and the solder pieces are made from a third element that contains at least tin.

(2) Preferably, the second element further contains silver.

(3) Preferably, the insulative base is made from polyethylene terephthalate.

(4) Preferably, the lands are larger than the second conductive elements.

(5) Preferably, resin is disposed at least between the electronic component and the insulative base.

(6) A method of producing a mounting board according to another aspect of the invention is a method of producing a mounting board which includes: an insulative base; a plurality of first conductive elements provided on the insulative base and having lands; a plurality of second conductive elements disposed on the lands; a plurality of solder pieces each disposed on each of the second conductive elements; and an electronic component which includes electrode sections each contacting each of the solder pieces, wherein the first conductive elements are made from a first element that contains at least silver; the second conductive elements are made from a second element that contains at least copper; and the solder pieces are made from a third element that contains at least tin, the method including: forming the first conductive elements and the second conductive elements on the insulative base; forming the solder pieces on the second conductive elements; and mounting the electronic component with each of the electrode sections contacting with each of the solder pieces.

(7) Preferably, resin is provided between the electronic component and the insulative base and at least between the electronic component and the insulative base is filled with the resin.

In the mounting board (1), the electrode sections of the electronic component and the second conductive elements are electrically connected together using not a silver-containing conductive adhesive but tin-containing solder. With this configuration, even if the electrode sections of the electronic component are made from tin, no galvanic corrosion occurs and thus no unstable connection may be established unlike in conventional mounting boards. Since the second conductive elements and the electrode sections are electrically connected together by metal connection, stable conduction can be established and the connection reliability can be improved. In addition, unlike those using a conductive adhesive, the solder pieces are not likely to lose viscosity and flow out to be electrically connected together. Thus, the distance between the solder pieces can be reduced. Accordingly, a mounting board on which small electronic components can be mounted is provided.

According to the method (6) of producing a mounting board, the second conductive elements and the electrode sections of the electronic component are electrically connected together by soldering. The solder pieces are thus not likely to lose viscosity and be electrically connected together during production of the mounting board unlike those using a conductive adhesive. Therefore, yields of products can be improved. The distance between the solder pieces can be reduced and thus small electronic components can be mounted on the mounting board.

Figure 1:
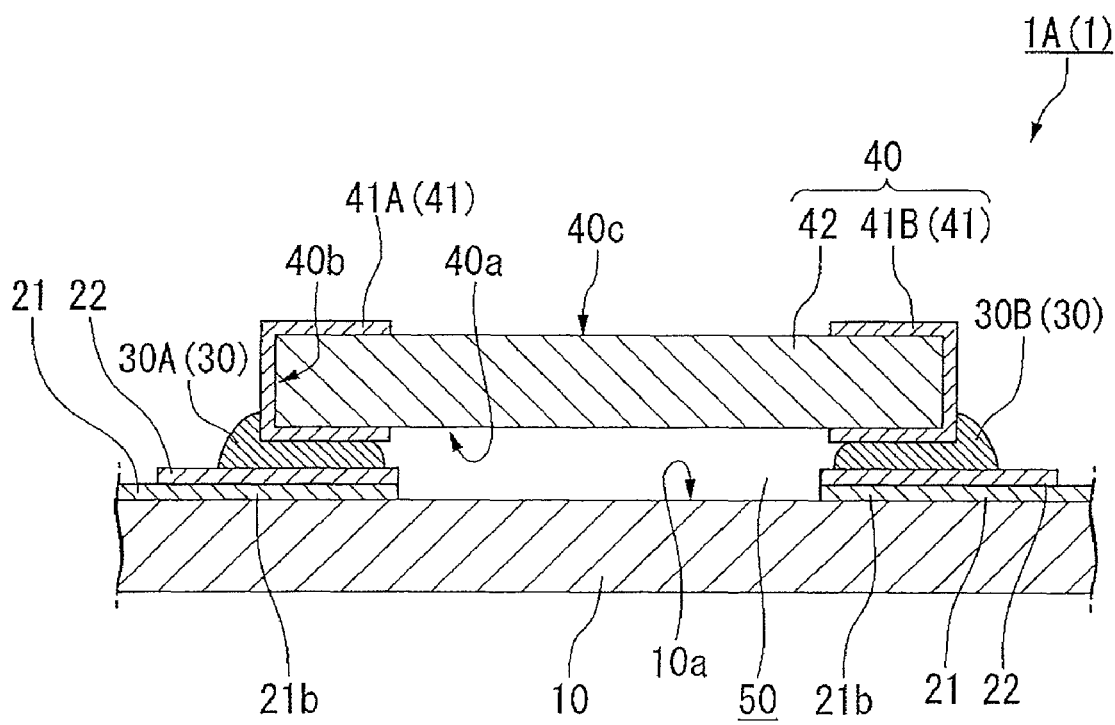
FIG. 1 is a cross-sectional view schematically showing a mounting board according to a first embodiment of the invention.

| Description of the Reference Numerals | |
|---|---|
| 1 (1A, 1B, 1C, 1D, 1E, 1F and 1G): | mounting board |
| 10: | insulative base |
| 21: | first conductive elements |
| 21b: | land |
| 22: | second conductive elements |
| 30 (30A and 30B): | solder |
| 40: | electronic component |
| 41 (41A and 41B): | electrode section |
| 42: | main body |
| 50: | space |
| 60: | resin |
| 70: | resist |

DESCRIPTION OF THE PREFERRED EMBODIMENTS

Referring now to the drawings, the invention will be described in detail. The invention, however, is not limited to those described, and various modifications may be made without departing from the spirit and scope of the invention.

First Embodiment

FIG. 1 is a cross-sectional view schematically showing an exemplary mounting board according to the invention.

A mounting board 1 of the invention schematically includes: an insulative base 10; a plurality of first conductive elements 21 provided on the insulative base 10 and having lands 21b; a plurality of second conductive elements 22 disposed on the lands 21b; a plurality of solder pieces 30 each disposed on each of the second conductive elements 22; and an electronic component 40 which includes electrode sections 41 each contacting each of the solder pieces 30. The first conductive elements 21 are made from a first element that contains at least silver. The second conductive elements 22 are made from a second element that contains at least copper. The solder pieces 30 are made from a third element that contains at least tin.

Hereinafter, each component will be described in detail.

The insulative base 10 is made from resin, glass or other materials, among which resin is preferred for its flexibility. A film-shaped resin sheet made from PET is preferably used.

The first conductive elements 21 and the second conductive elements 22 are disposed on a surface 10a of the insulative base 10 and are conducted with the electrode sections 41 of the electronic component 40. The first conductive elements 21 are covered with unillustrated resist such that areas other than the lands 21b of the first conductive elements 21 and vicinities thereof are not exposed. The resist may be a conventionally well-known material. Although two first conductive elements 21 and two second conductive elements 22 are illustrated in the drawing, their numbers are not particularly limited. Rather, for example, a plurality of the first conductive elements 21, a plurality of the second conductive elements 22, a plurality of the solder pieces 30, and a plurality of the electrode sections 41 of the electronic component 40 may be provided in space section 50 defined by the insulative base 10 and the main body 42 of the electronic component 40. These components may be electrically connected to one another.

The first conductive elements 21 and the second conductive elements 22 are preferably made from materials having similar resistance values and mutually causing minimum chemical reaction at an interface therebetween. For example, the first conductive elements 21 may be made from a first element which contains at least silver. The first element may be, in addition to silver, an alloy of platinum, gold, nickel, palladium and other substances. Since the first conductive elements 21 are made from the silver-containing first element, the second conductive elements 22 may preferably be made from a second element which contains copper having similar resistance value to that of silver, and being not likely to cause chemical reaction at interfaces with the first conductive elements 21. The second element may be, in addition to copper, an alloy of silver, gold, platinum, nickel, palladium and other substances. The first conductive elements 21 and the second conductive elements 22 may have thickness of, for example, 1 to 100 μm.

The solder pieces 30 (30A, 30B) electrically connects the second conductive elements 22 and the electrode sections 41 of the electronic component 40. The solder pieces 30 are made from a third element which contains at least tin. The third element may preferably be made from a material further containing bismuth, which is compatible with the electrode sections 41 that may contain tin. The solder pieces 30 may be, for example, Sn—Bi solder. The content of Bi can be suitably adjusted depending on the electrode sections 41 of the electronic component 40, the insulative base 10, the second conductive elements 22 and other components to which the solder pieces 30 may be applied. For example, the solder pieces 30 may be $Sn_{42}Bi_{58}$ solder.

Especially in soldering to the insulative base 10 which is a membrane circuit board made from a film such as PET, typical lead-free solder that requires soldering temperature of not less than 180° C. may cause damage to the insulative base 10. Therefore, Sn—Bi low-temperature solder with soldering temperature of not more than 165° C. is preferably used.

The electronic component 40 is electrically connected to the first conductive elements 21 and the second conductive elements 22 on the insulative base 10. The electronic component 40 includes a main body 42 and electrode sections 41 electrically connected to the second conductive elements 22.

The main body 42 is not particularly limited, and may be a well-known material.

Each of the electrode sections 41 is provided to extend from a first surface 40a to a second surface 40c via a side surface 40b of the electronic component 40 as shown in FIG. 1. The electrode sections 41 may be made from any well-known material, such as tin, gold and copper.

Configuration of the electrode sections 41 is not limited to that illustrated in FIG. 1. Each of the electrode sections 41 may be provided to extend from the first surface 40a to the side surface 40b of the electronic component 40. Alternatively, the electrode sections 41 may be disposed only on the first surface 40a of the electronic component 40 of the main body 42 which faces the insulative base 10. Areas of the electrode sections 41 may be extended to reach the side surface 40b of the electronic component 40 to establish conduction with the solder pieces 30. Thus, contact areas of the solder pieces 30 and the electrode sections 41 increase to improve connection reliability. The electrode sections 41 may be disposed at corners of the electronic component 40 to provide electrical connection with the solder pieces 30 on three surfaces, thereby providing further increased contact areas and thus improving connection reliability. As shown in FIG. 1, with the electrode sections 41 provided to extend from the first surface 40a to the second surface 40c of the electronic component 40, the electronic component 40 can be conducted with other substrates or other electronic components at the second surface 40c side.

In the mounting board 1A of the invention, the second conductive elements 22 and the electrode sections 41 of the electronic component 40 are electrically connected together by metal connection using the solder pieces 30. Thus, the connection is stable and poor conduction is reduced. Further, unlike those using a conductive adhesive, the solder pieces 30 are not likely to lose viscosity and flow out to be electrically connected together. The distance between the solder pieces 30 can therefore be reduced. In this manner, the mounting board 1 on which small electronic components 40 can be mounted is provided.

The first conductive elements 21 are made from the silver-containing first element and the second conductive elements 22 are made from the copper-containing second element. The tin-containing solder pieces 30 such as low-temperature solder having poor solderability with the first conductive elements 21 but having high solderability with the second conductive elements 22 may be employed to improve connection reliability between the solder pieces 30 and the second conductive elements 22. Unlike connection of the tin-containing solder pieces 30 and the silver-containing first conductive elements 21, galvanic corrosion is not likely to occur in the connection of the tin-containing solder pieces 30 and the copper-containing second conductive elements 22. The tin-containing solder pieces 30 ensures stable connection with the electrode sections 41 made of any one of tin, copper, gold, and other substances. Accordingly, connection reliability between the solder pieces 30 and the second conductive elements 22 and between the solder pieces 30 and the electrode sections 41 can be improved. Since copper contained in the second conductive elements 22 has similar resistance value to that of silver contained in the first conductive elements 21, chemical reaction is not likely to occur in the interfaces between the first conductive elements 21 and the second conductive elements 22. In this manner, the mounting board 1A with improved connection reliability is provided.

Next, a method of producing the mounting board 1A according to the present embodiment will be described with reference to FIGS. 2A to 2D.

Figure 2A:
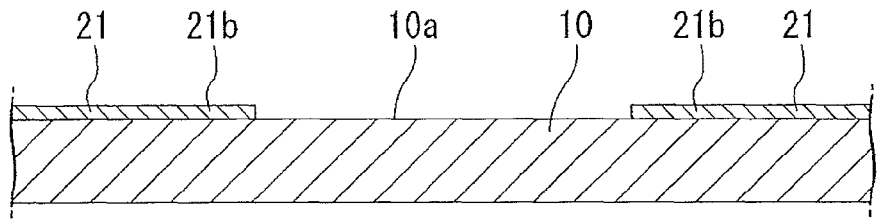
FIG. 2A is a cross-sectional process diagram schematically showing a method of producing the mounting board according to the first embodiment.

First, as shown in FIG. 2A, the first element made from, for example, silver paste is applied to the surface 10a of the insulative base 10 by, for example, screen printing. The first element is then dried by heat to provide the first conductive elements 21 with lands 21b formed thereon.

Figure 2B:
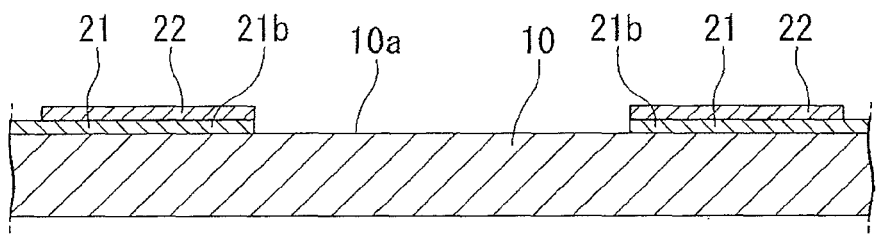
FIG. 2B is a cross-sectional process diagram schematically showing the method of producing the mounting board according to the first embodiment.

Next, as shown in FIG. 2B, the second element made from, for example, copper paste is applied to the lands 21b of the first conductive elements 21 by, for example, screen printing. The second element is then dried by heat to provide the second conductive elements 22.

Figure 2C:
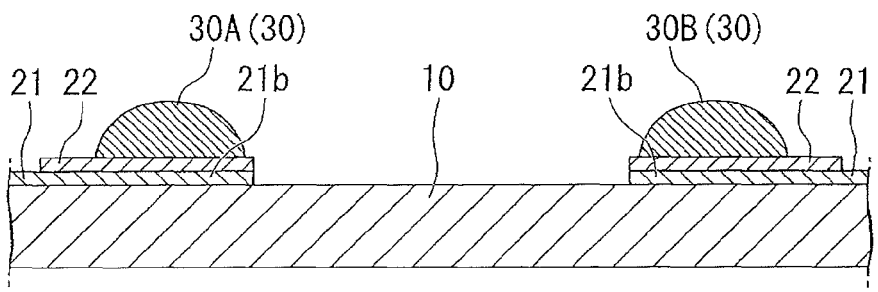
FIG. 2C is a cross-sectional process diagram schematically showing the method of producing the mounting board according to the first embodiment.

Next, as shown in FIG. 2C, the solder pieces 30, e.g., Sn/Bi low-temperature solder pieces 30 made from the tin-contained third element, are applied to the second conductive elements 22 by, for example, screen printing or dispensing. Distance between adjacent solder pieces 30 and distance between the insulative base 10 and the electronic component 40 can be suitably adjusted depending on the electronic component 40 to be mounted.

Figure 2D:
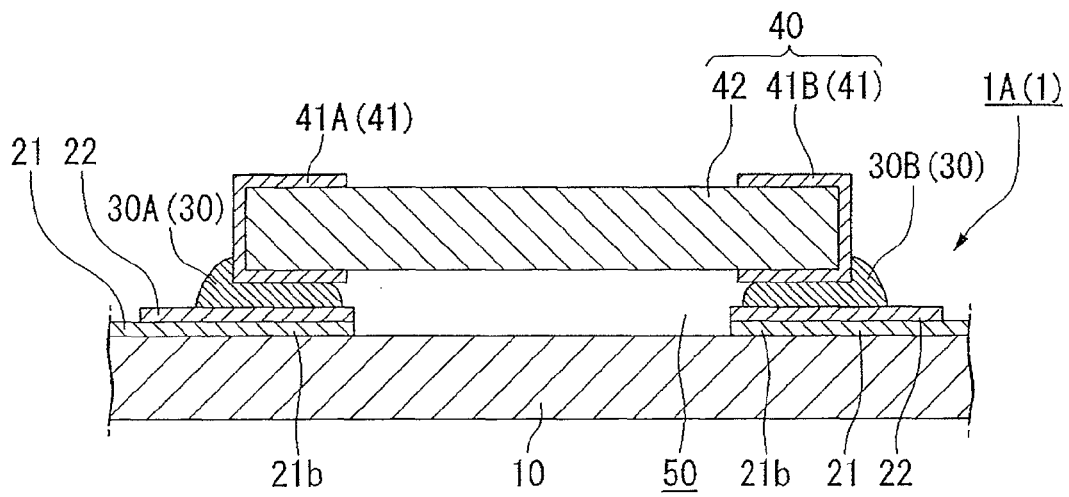
FIG. 2D is a cross-sectional process diagram schematically showing the method of producing the mounting board according to the first embodiment.

Next, as shown in FIG. 2D, the electrode sections 41 of the electronic component 40 are aligned with the positions to which the solder pieces 30 are applied. Each of the electrode sections 41 is made into contact with each of the solder pieces 30, and then heated to mount the electronic component 40.

In this manner, the mounting board 1A of the present embodiment is provided.

In the method of producing the mounting board 1A of the present embodiment, the second conductive elements 22 and the electrode sections 41 of the electronic component 40 are electrically connected together via the solder pieces 30. Unlike those using a conductive adhesive, the solder pieces 30 are not likely to lose viscosity and the solder pieces 30A and 30B are not likely to flow out to be electrically connected together. With this configuration, the distance between the solder pieces 30A and 30B can be reduced, thereby allowing the small electronic component 40 to be mounted. Due to a self-alignment property of the solder pieces 30, the electronic component 40 can be mounted more precisely as compared to those using conductive paste.

Modified Embodiment

Figure 3A:
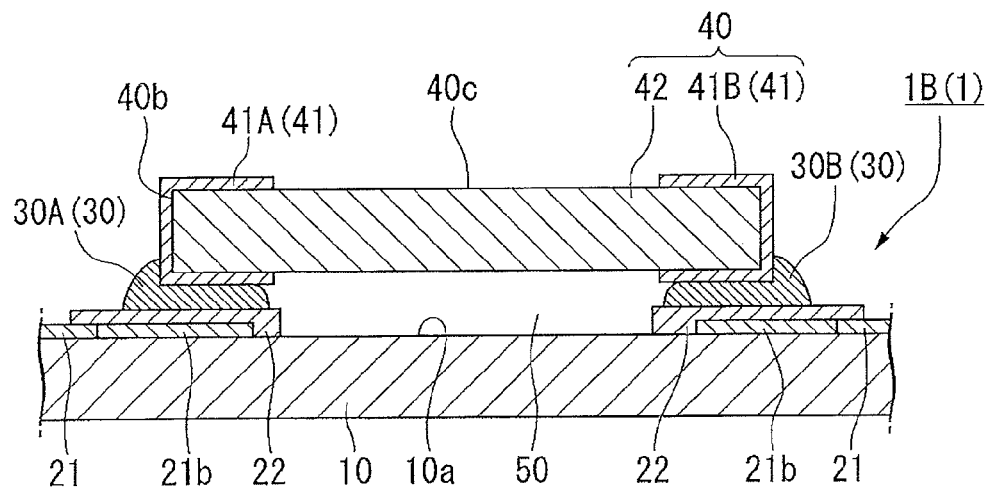
FIG. 3A is a cross-sectional view schematically showing a mounting board according to a modified embodiment of the invention.
Figure 3B:
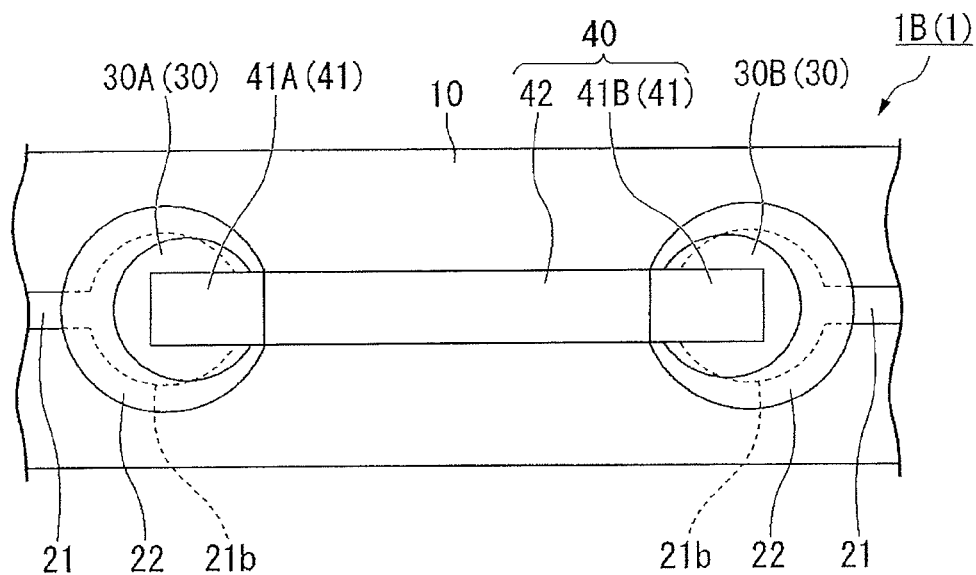
FIG. 3B is a plan view schematically showing the mounting board according to the modified embodiment.
Figure 3C:
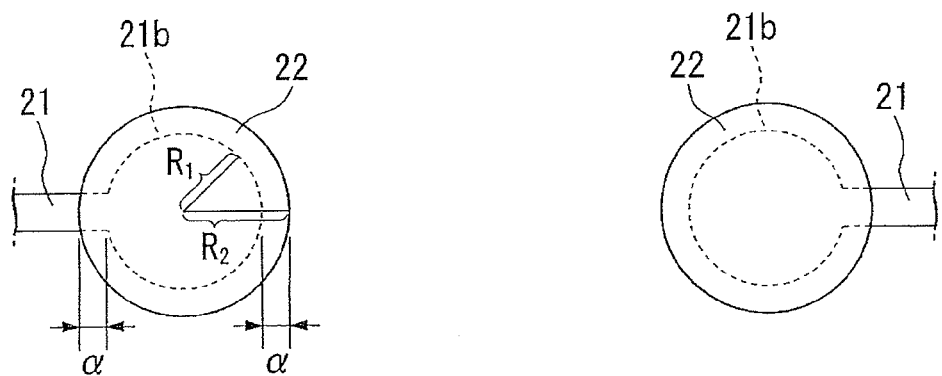
FIG. 3C is a plan view schematically showing a vicinity of a land of the mounting board according to the modified embodiment.

FIGS. 3A, 3B and 3C schematically show an exemplary mounting board 1B according to a modified embodiment of the present embodiment. FIG. 3A is a cross-sectional view and FIG. 3B is a plan view of the mounting board 1B. FIG. 3C is a plan view of vicinities of lands 21b.

In the mounting board 1B of the modified embodiment, second conductive elements 22 are larger than the lands 21b of first conductive elements 21.

The radius R2 of the second conductive elements 22 is larger than the radius R1 of the lands 21b of the first conductive elements 21 by a as shown in FIG. 3C. Preferably, a is larger than a degree of printing alignment accuracy during production of the second conductive elements 22, and is not less than 0.2 mm, for example. The second conductive elements 22 are not necessarily formed concentric with the lands 21b, as shown in FIGS. 3A to 3C.

Thickness of the second conductive elements 22 is suitably adjusted depending on the electronic equipment in which the mounting board of the present embodiment is used. If the mounting board is to be bent a plurality of times, thin second conductive elements are preferred. Similarly, as to the size of the second conductive elements 22, if the mounting board is to be bent a plurality of times, smaller radius R2 of the second conductive elements 22 is preferred. The radius R2 of the second conductive elements 22 may be sufficiently large if prevention of migration, galvanic corrosion and short circuit of the solder pieces 30 is more important than the bending property.

According to the mounting board 1B of the modified embodiment, since the lands 21b of the first conductive elements 21 are covered with the second conductive elements 22, the solder pieces 30 are not likely to flow into the lands 21b during melting and curing. Accordingly, the solder pieces 30 and the lands 21b never come into direct contact with each other. As a result, occurrence of short circuit of the solder pieces 30 and occurrence of galvanic corrosion or migration between the solder pieces 30 and the lands 21b can be prevented. If the Sn/Bi low-temperature solder having high solderability with copper (i.e., the second conductive elements 22) is employed, larger-sized second conductive elements 22 may provide improved connection reliability with the solder pieces 30.

Second Embodiment

Figure 4A:
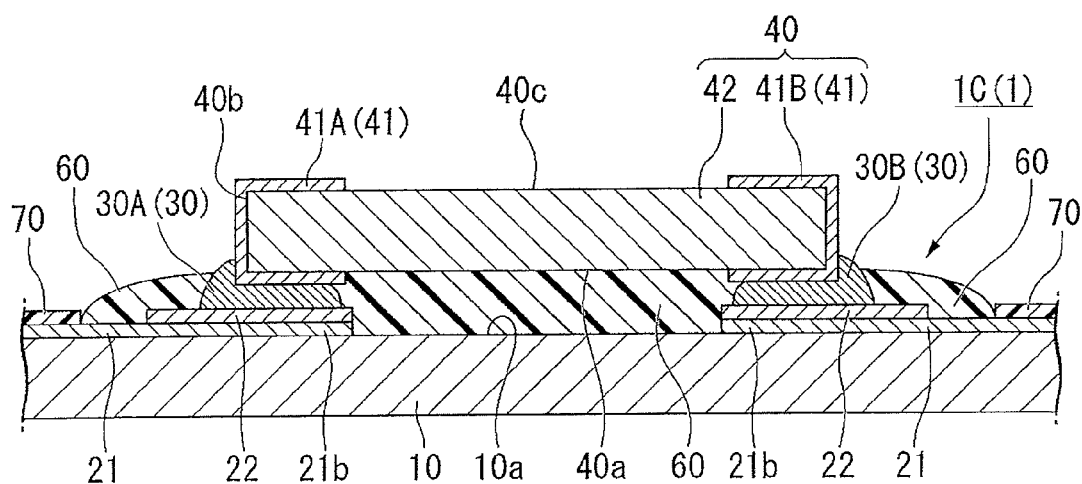
FIG. 4A is a cross-sectional view schematically showing a mounting board according to a second embodiment of the invention.

FIG. 4A is a cross-sectional view schematically showing a mounting board 1C according to a second embodiment of the invention. The mounting board 1C of the present embodiment differs from the mounting board 1A of the first embodiment in that resin 60 is provided in space 50 at least between an electronic component 40 and an insulative base 10. Also in the present embodiment, first conductive elements 21 are covered with resist 70 such that areas other than lands 21b of the first conductive elements 21 and vicinities thereof are not exposed.

The resin 60 is not particularly limited so long as it is thermosetting and is used as a non-conductive adhesive agent. Examples of the resin 60 may include epoxy resin and acrylic resin.

The resin 60 is disposed in the space 50 between the electronic component 40 and the insulative base 10 so as to adhere to the electronic component 40 and the insulative base 10, thereby improving fixing strength of the electronic component 40 to the insulating substrate 10. Preferably, as shown in FIG. 4A, the resin 60 is provided not only in the space 50 between the electronic component 40 and the insulative base 10 but also over the exposed first conductive elements 21, the lands 21b and the second conductive elements 22 to seal the same. With this configuration, moisture ingression due to, for example, dew condensation into the conductive sections (i.e., the first conductive elements 21, the second conductive elements 22, the solder pieces 30 and the connection sites thereof) hardly occurs. Accordingly, the mounting board in which migration is not likely to occur can be provided.

Figure 14:
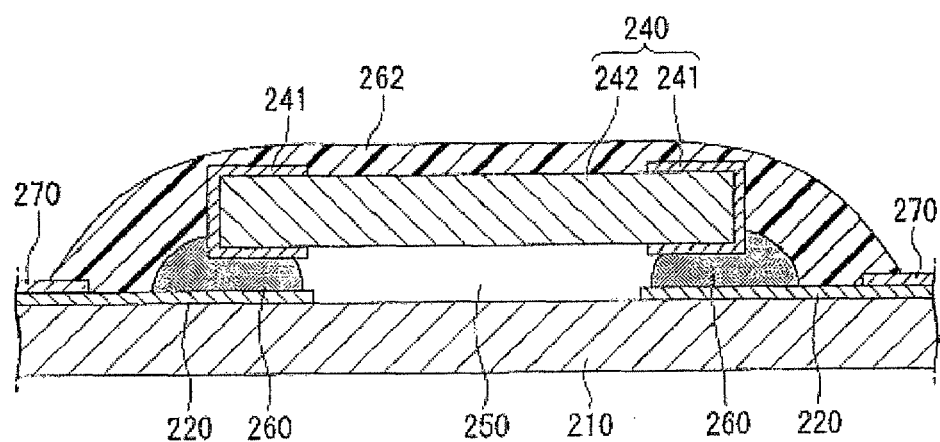
FIG. 14 is a cross-sectional view schematically showing a further exemplary conventional mounting board.

In a conventional mounting board using a conductive adhesive, as shown in FIG. 14, the electronic component 240 is also sealed by the resin 262. In the present embodiment, however, the resin 60 is provided to seal the conductive sections and the space 50 without sealing the electronic component 40. Accordingly, the mounting board 1C of the present embodiment has achieved an effect, in addition to the effects described above, that electronic components can be mounted with higher density as compared to conventional mounting boards.

Figure 4B:
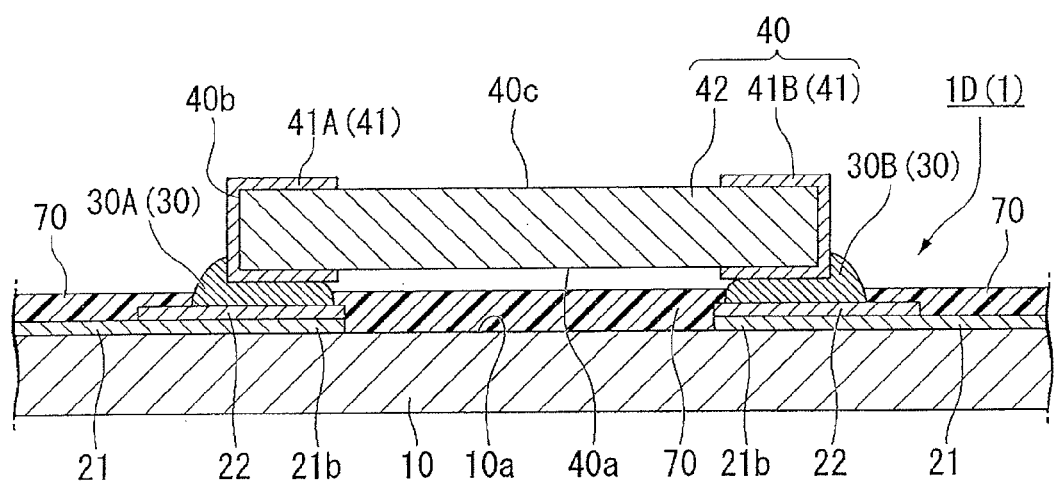
FIG. 4B is a cross-sectional view schematically showing a modified embodiment of the mounting board according to the second embodiment.

In the present embodiment, as shown in FIG. 4B, the resist 70 which is provided to prevent the first conductive elements 21 from exposing may be used to cover areas other than the electronic component 40 and the low-temperature solder pieces 30 instead of the resin 60 which seals the first conductive elements 21 and the second conductive elements 22 so that they are not exposed. Thickness of the resist 70 can be suitably adjusted depending on the electronic equipment or other components in which the mounting board is used, and may be 20 to 40 μm, for example. Excessively thick resist 70 may impair mounting property (i.e., connectivity and machine strength) in mounting the electronic component 40. On the contrary, excessively thin resist 70 may hardly demonstrate resist property. In the mounting board 1D shown in FIG. 4B, moisture ingression due to, for example, dew condensation into the conductive sections (i.e., the first conductive elements 21, the second conductive elements 22, the solder pieces 30 and the connection sites thereof) hardly occurs like those using the resin 60. Accordingly, the mounting board in which migration is not likely to occur can be provided.

The resin 60 may also be applied to the mounting board 1B according to the modified embodiment as well as to the mounting board of present embodiment to provide the same effects as those of the mounting board 1C of the second embodiment.

Third Embodiment

Figure 5A:
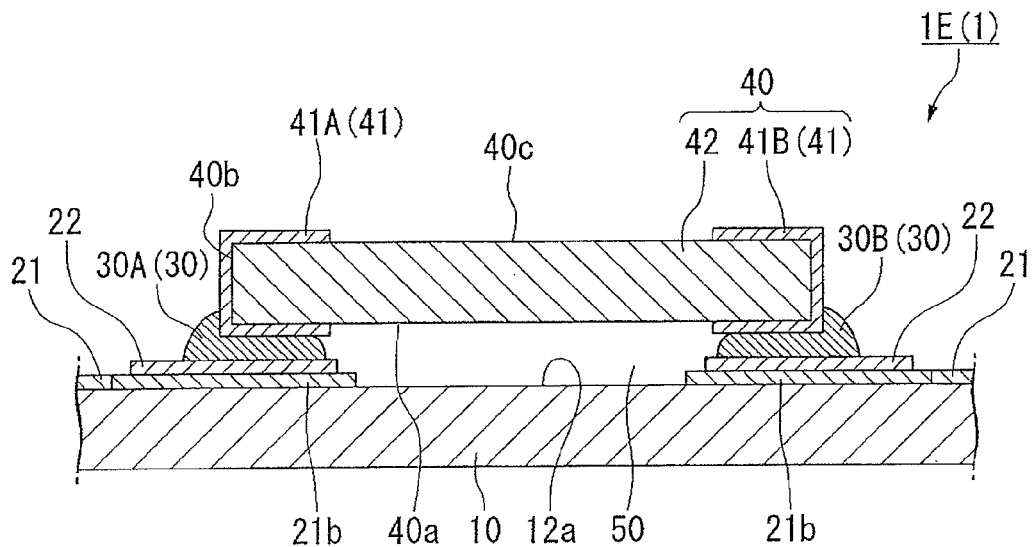
FIG. 5A is a cross-sectional view schematically showing a mounting board according to a third embodiment of the invention.
Figure 5B:
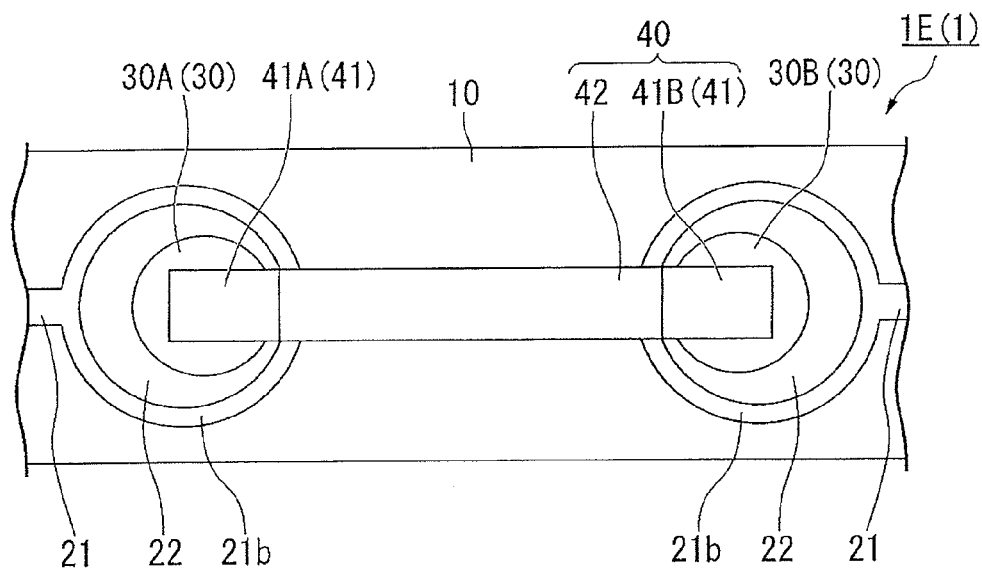
FIG. 5B is a plan view schematically showing the mounting board according to the third embodiment.
Figure 5C:
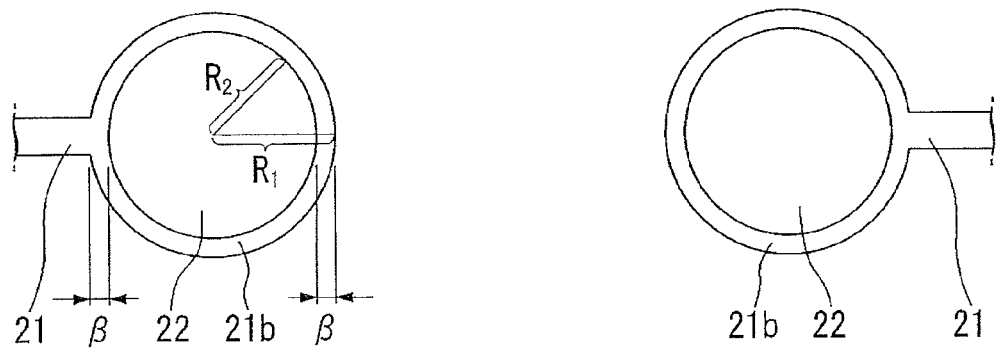
FIG. 5C is a plan view schematically showing a vicinity of a land of the mounting board according to the third embodiment.

FIGS. 5A, 5B and 5C schematically show a mounting board 1E according to a third embodiment of the invention. FIG. 5A is a cross-sectional view and FIG. 5B is a plan view of the mounting board 1E. FIG. 5C is a plan view of vicinities of lands 21b. In the mounting board 1E of the present embodiment, second conductive elements 22 are smaller than the lands 21b of first conductive elements 21.

The radius R1 of the lands 21b of the first conductive elements 21 is larger than the radius R2 of the second conductive elements 22 by $\beta$ as shown in FIG. 5C. Preferably, $\beta$ is larger than a degree of printing alignment accuracy during production of the second conductive elements 22, and is not less than 0.2 mm, for example. As shown in FIGS. 5A to 5C, the second conductive elements 22 are not necessarily formed concentric with the lands 21b.

The mounting board 1E of the present embodiment has achieved an effect, in addition to the effects obtained by the mounting board 1A of the first embodiment described above, that the mounting board 1E has greater flexibility as compared to the mounting board 1B of the modified embodiment since the copper-made second conductive elements 22 are smaller than the lands 21b of the first conductive elements 21. As a result, the mounting board 1E of the present embodiment is suitable for an electric apparatus which repeatedly being bent.

Fourth Embodiment

Figure 6A:
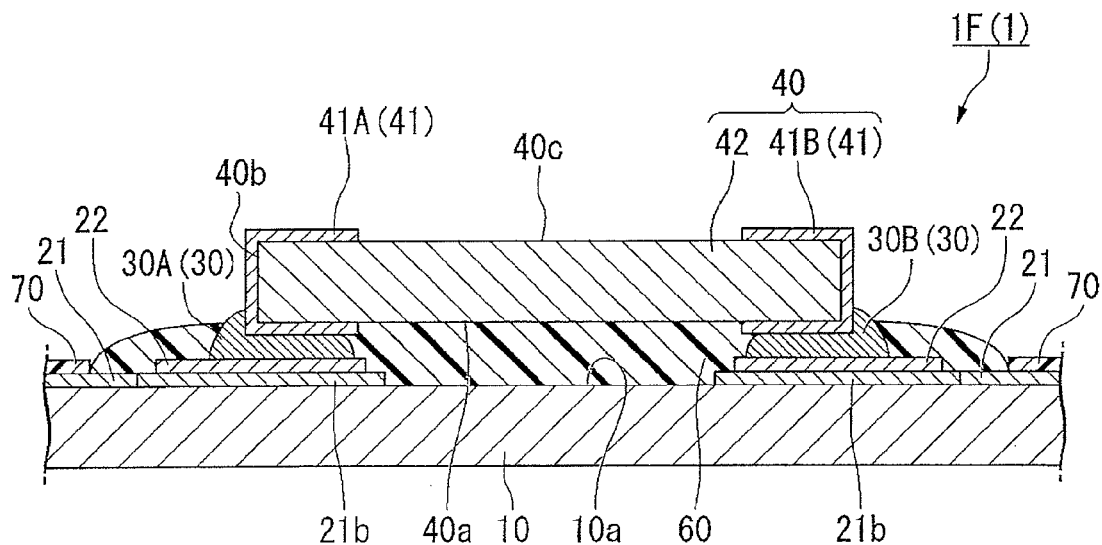
FIG. 6A is a cross-sectional view schematically showing a mounting board according to a fourth embodiment of the invention.
Figure 6B:
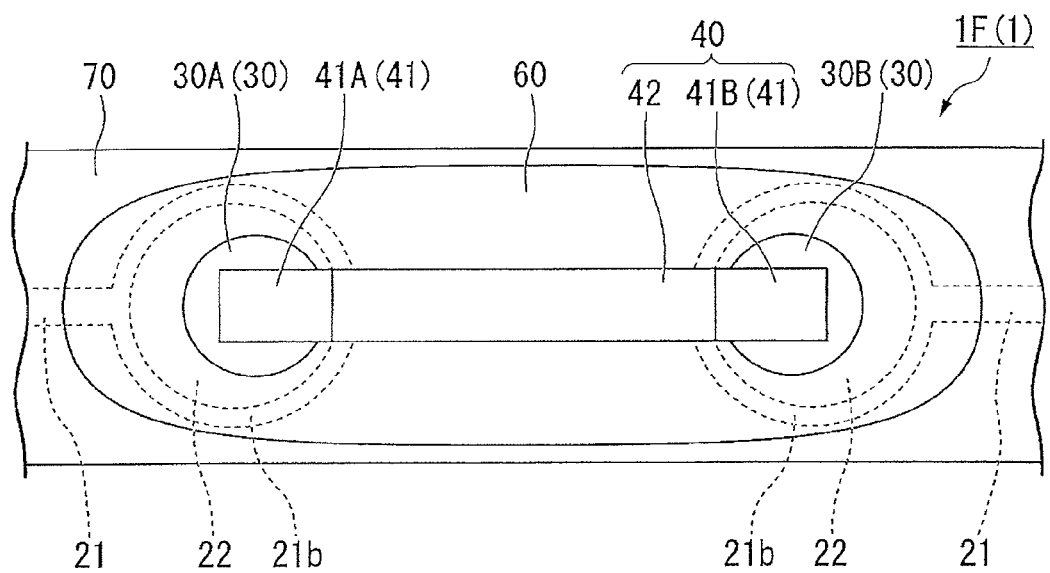
FIG. 6B is a plan view schematically showing the mounting board according to the fourth embodiment.

FIGS. 6A and 6B schematically show a mounting board 1F according to a fourth embodiment of the invention. FIG. 6A is a cross-sectional view and FIG. 6B is a plan view of the mounting board 1F. The mounting board 1F of the present embodiment differs from the mounting board 1E of the third embodiment in that resin 60 is provided at least in space 50 between an electronic component 40 and an insulative base 10.

The resin 60 is the same as that in the second embodiment. The effects of the mounting board 1B of the second embodiment and the effects of the mounting board 1E of the third embodiment are obtained in the mounting board 1F of the present embodiment.

Also in the present embodiment, areas other than the electronic component 40 and low-temperature solder pieces 30 may be covered with resist 70 instead of the resin 60 so that first conductive elements 21 and second conductive elements 22 are not exposed. In this case, like those using the resin 60, moisture ingression due to, for example, dew condensation into the conductive sections (i.e., the first conductive elements 21, the second conductive elements 22, the solder pieces 30 and the connection sites thereof) hardly occurs. Accordingly, the mounting board in which migration is not likely to occur can be provided.

Next, a method of producing the mounting board 1F of the present embodiment will be described with reference to FIGS. 7A to 7E.

Figure 7A:
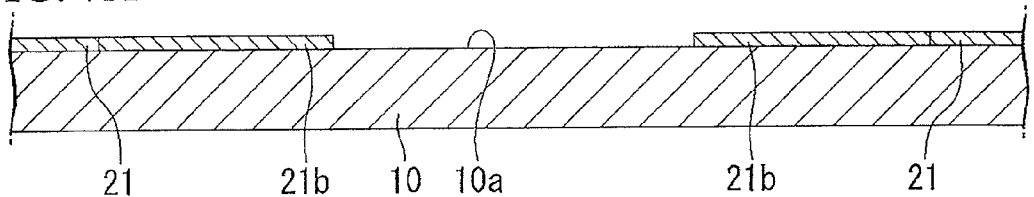
FIG. 7A is a cross-sectional process diagram schematically showing a method of producing the mounting board according to the fourth embodiment.
Figure 7B:
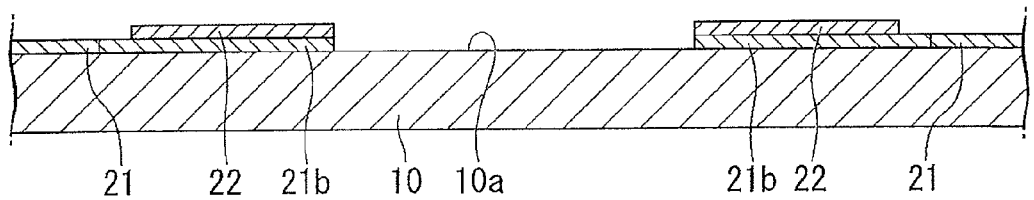
FIG. 7B is a cross-sectional process diagram schematically showing a method of producing the mounting board according to the fourth embodiment.

First, as shown in FIGS. 7A and 7B, the first conductive elements 21 and the second conductive elements 22 are formed on a surface 10a of the insulative base 10 in the same manner as in the first embodiment. Lands 21b of the first conductive elements 21 are formed larger than the second conductive elements 22 by an amount over a degree of printing alignment accuracy. With this configuration, the second conductive elements 22 are always inside the lands 21b.

Figure 7C:
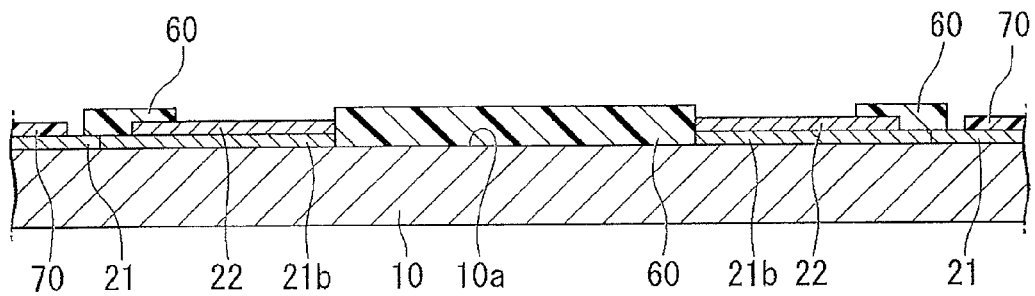
FIG. 7C is a cross-sectional process diagram schematically showing a method of producing the mounting board according to the fourth embodiment.

Next, as shown in FIG. 7C, the resist 70 is printed by screen printing in areas including the vicinities of the lands 21b so as to cover the exposed first conductive elements 21. The resist 70 is then dried. The resin 60 is printed by screen printing on the second conductive elements 22 in areas other than portions where the low-temperature solder pieces 30 are to be applied, on the exposed lands 21b and on the first conductive elements 21. As the resin 60 is provided in those areas, the first conductive elements 21 and the second conductive elements 22 are not exposed in the subsequent step and the conductive sections (i.e., the first conductive elements 21, the second conductive elements 22, the solder pieces 30 and the connection sites thereof) may be sealed with the resin 60.

Figure 7D:
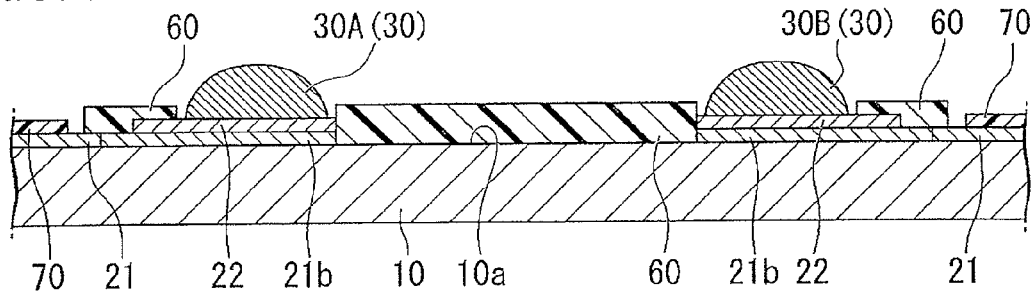
FIG. 7D is a cross-sectional process diagram schematically showing a method of producing the mounting board according to the fourth embodiment.

Next, as shown in FIG. 7D, the low-temperature solder pieces 30 are applied on the second conductive elements 22 in the same manner as in the first embodiment.

Figure 7E:
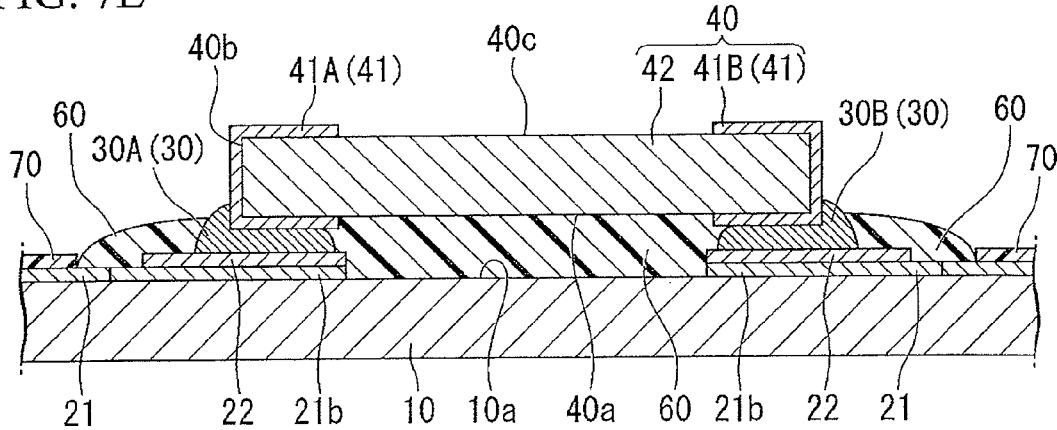
FIG. 7E is a cross-sectional process diagram schematically showing a method of producing the mounting board according to the fourth embodiment.

Next, as shown in FIG. 7E, the electrode sections 41 of the electronic component 40 are aligned with the positions where the solder pieces 30 are applied and the electronic component 40 is mounted. The mounting board is then heated.

In this manner, the mounting board 1F of the present embodiment is provided.

In the production method of the present embodiment, the low-temperature solder pieces 30 are applied to the lands 21b which were already covered with the resin 60. There is thus no possibility that the low-temperature solder pieces 30 flow into the lands 21b during melting and curing of the low-temperature solder pieces 30. Accordingly, the low-temperature solder pieces 30 and the lands 21b never come into direct contact with each other. As a result, occurrence of galvanic corrosion or migration between the low-temperature solder pieces 30 and the lands 21b can be prevented.

Fifth Embodiment

Figure 8A:
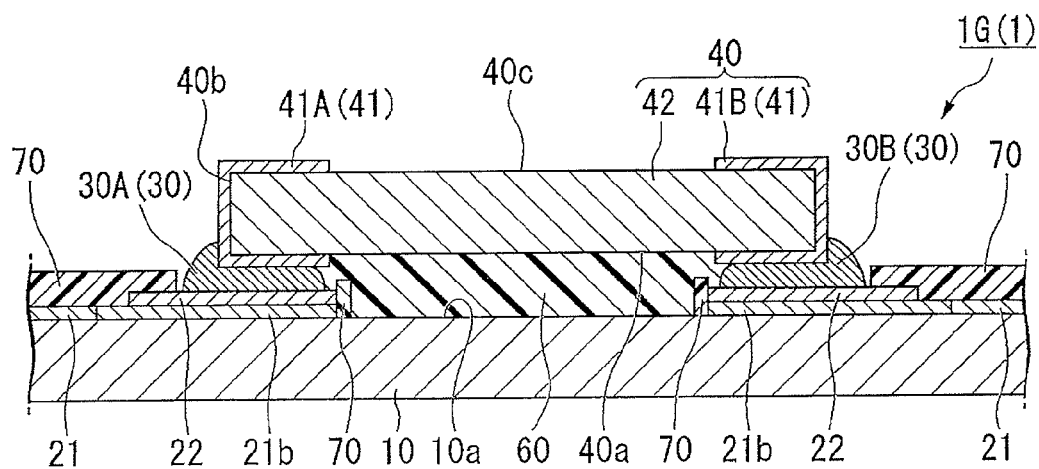
FIG. 8A is a cross-sectional view schematically showing a mounting board according to a fifth embodiment of the invention.
Figure 8B:
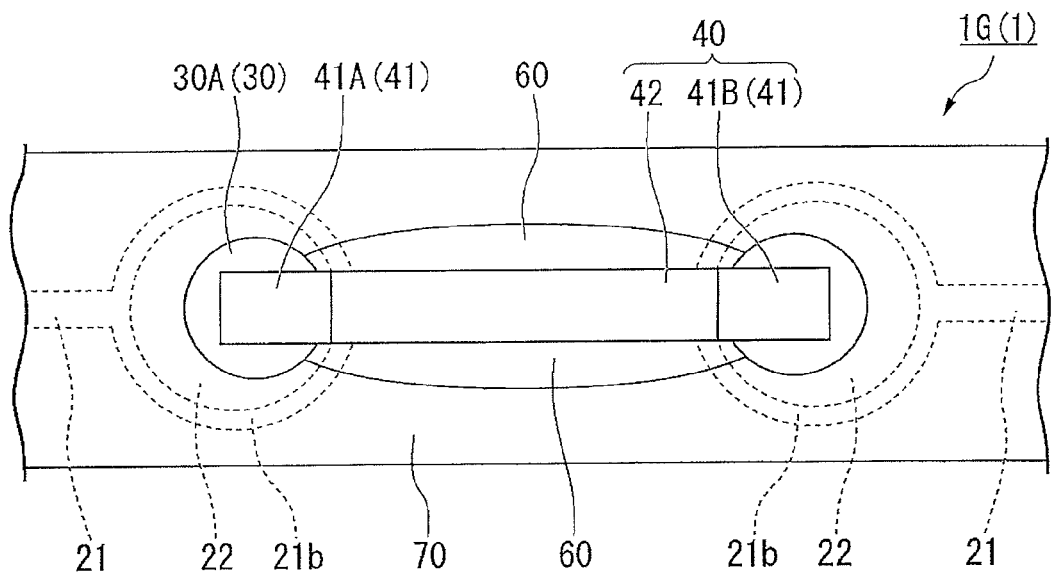
FIG. 8B is a plan view schematically showing the mounting board according to the fifth embodiment.

FIGS. 8A and 8B schematically show a mounting board 10 according to a fifth embodiment of the invention. FIG. 8A is a cross-sectional view and FIG. 8B is a plan view of the mounting board 1G. The mounting board 1G of the present embodiment differs from the mounting board 1E of the third embodiment in that resist 70 is provided to cover the second conductive elements 22, first conductive elements 21 and lands 21b except for areas where low-temperature solder pieces 30 are disposed on the second conductive elements 22, and that resin 60 is provided in space 50 so as to adhere to an electronic component 40 and an insulative base 10. Thickness of the resist 70 can be suitably adjusted depending on the electronic equipment or other components in which the mounting board is used, and may be 20 to 40 μm, for example. Excessively thick resist 70 may impair mounting property (i.e., connectivity and machine strength) in mounting the electronic component 40. On the contrary, excessively thin resist 70 may hardly demonstrate resist property.

In the mounting board 1G of the present embodiment, the first conductive elements 21, the lands 21b and the second conductive elements 22 are covered with the resist 70 and thus are not exposed. As in the mounting board 1E of the third embodiment, moisture ingression due to, for example, dew condensation into the conductive sections (i.e., the first conductive elements 21, the second conductive elements 22, the solder pieces 30 and the connection sites thereof) hardly occurs. Accordingly, migration resistance characteristics of an entire mounting section can be improved. The resin 60 adheres to both the electronic component 40 and the insulative base 10, thereby improving fixing strength of the entire mounting section.

Next, a method of producing the mounting board 1G of the present embodiment will be described with reference to FIGS. 9A to 9F.

Figure 9A:
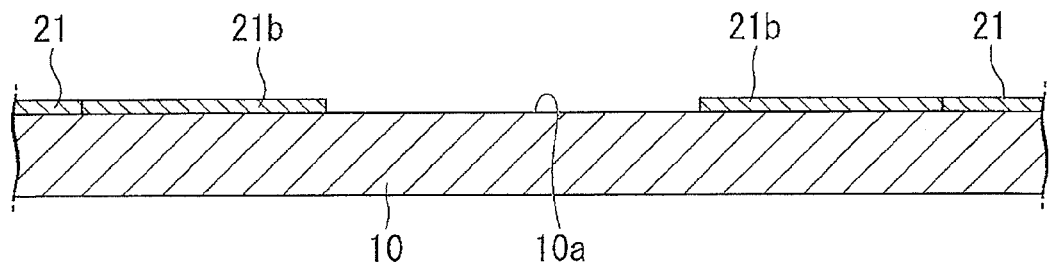
FIG. 9A is a cross-sectional process diagram schematically showing a method of producing the mounting board according to the fifth embodiment.
Figure 9B:
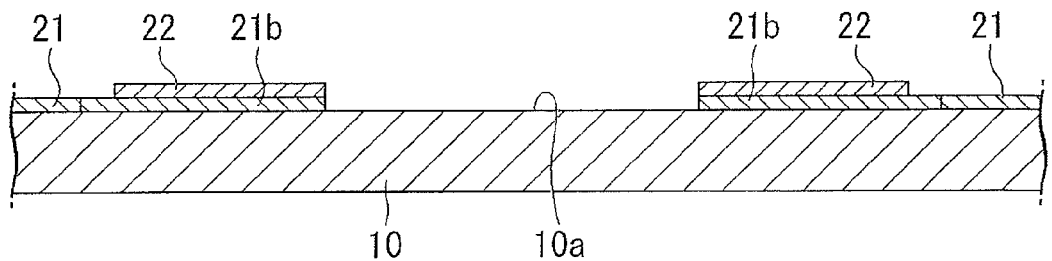
FIG. 9B is a cross-sectional process diagram schematically showing a method of producing the mounting board according to the fifth embodiment.

First, as shown in FIGS. 9A and 9B, the first conductive elements 21 and the second conductive elements 22 are formed on a surface 10a of the insulative base 10 in the same manner as in the fourth embodiment.

Figure 9C:
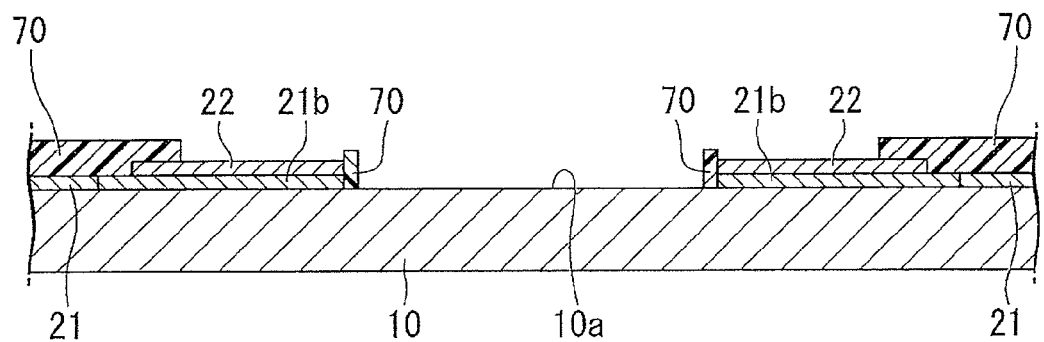
FIG. 9C is a cross-sectional process diagram schematically showing a method of producing the mounting board according to the fifth embodiment.

Next, as shown in FIG. 9C, the resist 70 is printed by screen printing so as to cover the first conductive elements 21, the lands 21b and the second conductive elements 22 except for portions where the low-temperature solder pieces 30 are applied on the second conductive elements 22. Then, the resist 70 is heated and dried.

Figure 9D:
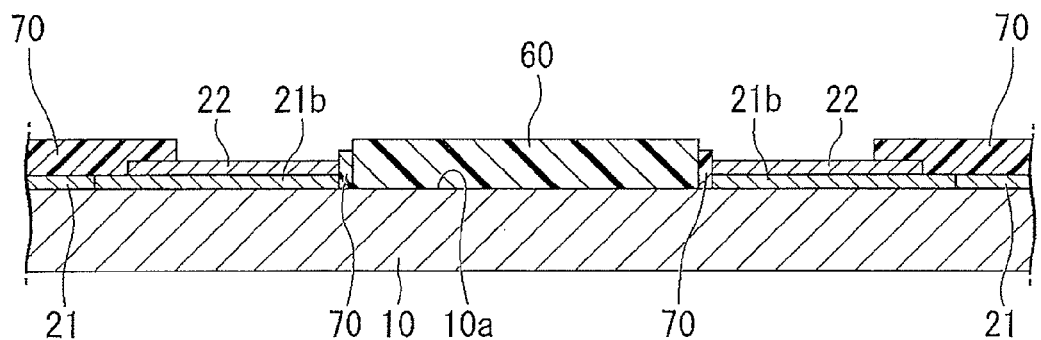
FIG. 9D is a cross-sectional process diagram schematically showing a method of producing the mounting board according to the fifth embodiment.

Next, as shown in FIG. 9D, the resin 60 is applied on the insulative base 10 by screen printing or dispensing to areas below the electronic component 40 is to be mounted.

Figure 9E:
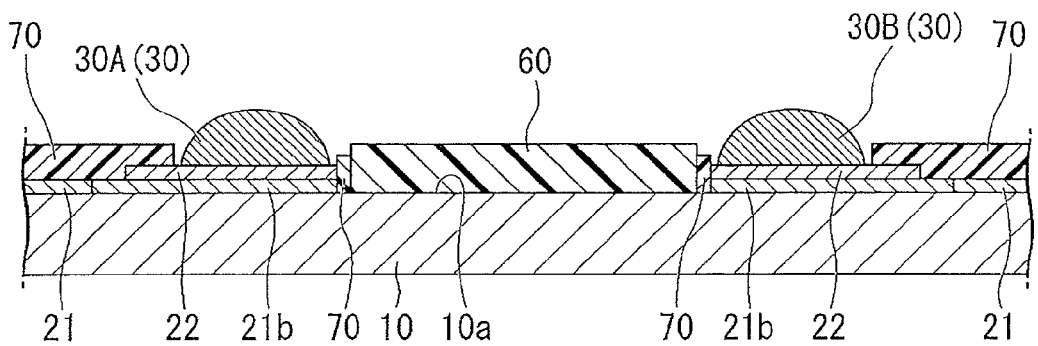
FIG. 9E is a cross-sectional process diagram schematically showing a method of producing the mounting board according to the fifth embodiment.

Next, as shown in FIG. 9E, the low-temperature solder pieces 30 are applied in the same manner as in the first embodiment.

Figure 9F:
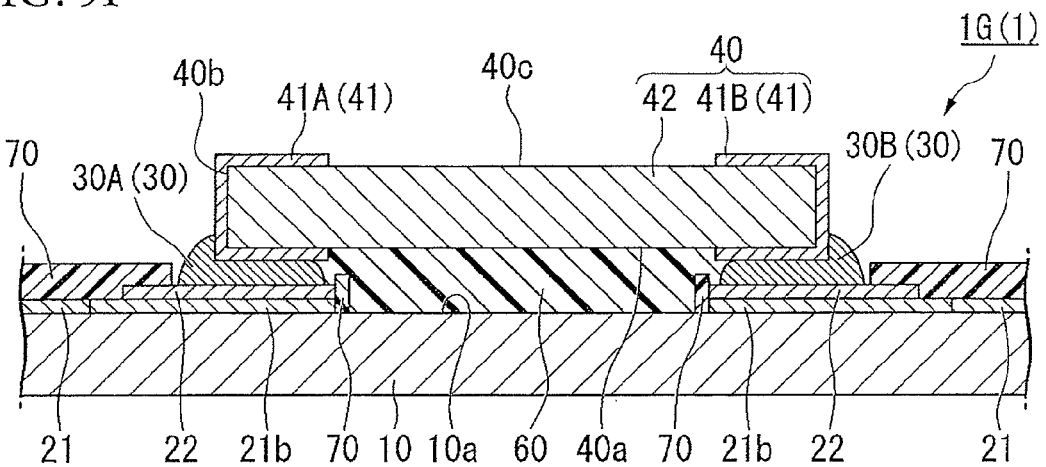
FIG. 9F is a cross-sectional process diagram schematically showing a method of producing the mounting board according to the fifth embodiment.

Next, as shown in FIG. 9F, the electrode sections 41 of the electronic component 40 are aligned with the areas where the solder pieces 30 are applied and then the electronic component 40 is mounted. Then, the mounting board is heated.

In this manner, the mounting board 1G of the present embodiment is provided.

In the production method of the present embodiment, since the lands 21b are covered with the resist, there is no possibility that the low-temperature solder pieces 30 flow into the lands 21b during melting and curing the low-temperature solder pieces 30. Thus, galvanic corrosion and migration can be prevented. In the production method of the present embodiment, the resin 60 is applied or printed onto the insulative base 10 after the lands 21b and the second conductive elements 22 are covered with the resist 70. Accordingly, the resist 70 disposed at ends of the second conductive elements 22 can prevent ingression of the resin 60 into areas of the second conductive elements 22 to which the solder pieces 30 are applied. Therefore, yields of products can be improved.

Figure 10A:
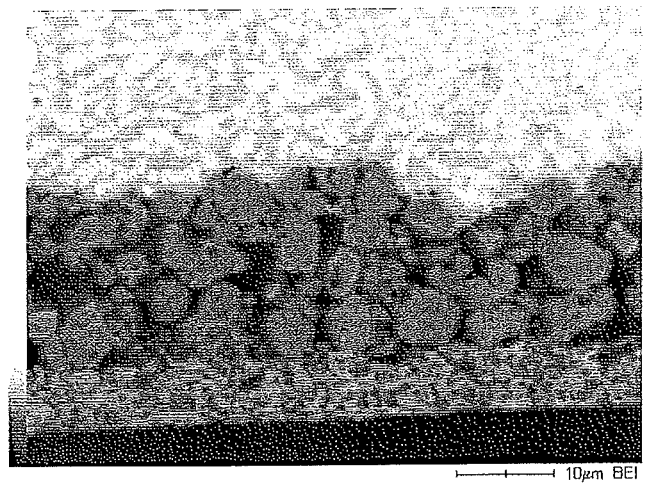
FIG. 10A is an image of a cross section of the mounting board according to the first embodiment of the invention photographed by using an electron microscope.
Figure 10B:
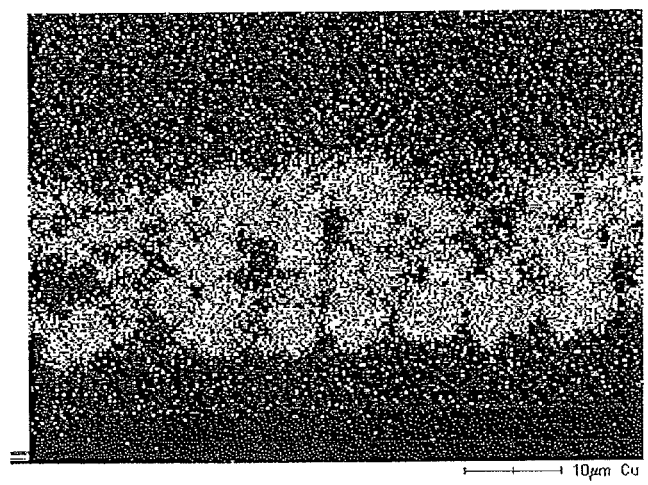
FIG. 10B shows distribution of copper in the image of FIG. 10A.
Figure 10C:
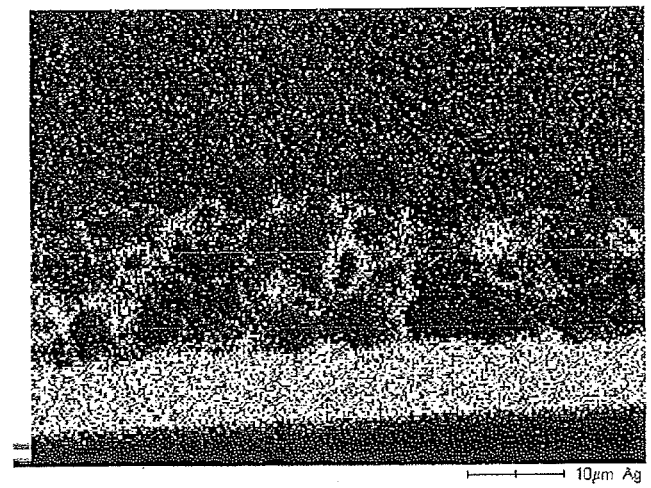
FIG. 10C shows distribution of silver in the image of FIG. 10A.
Figure 11A:
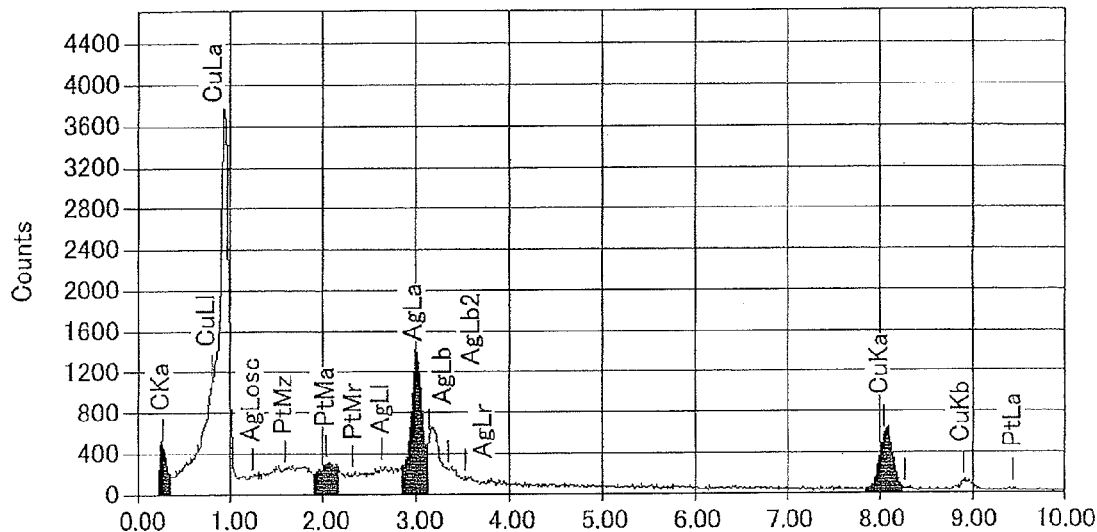
FIG. 11A shows a result of elemental analysis of an inside of a second conductive elements.
Figure 11B:
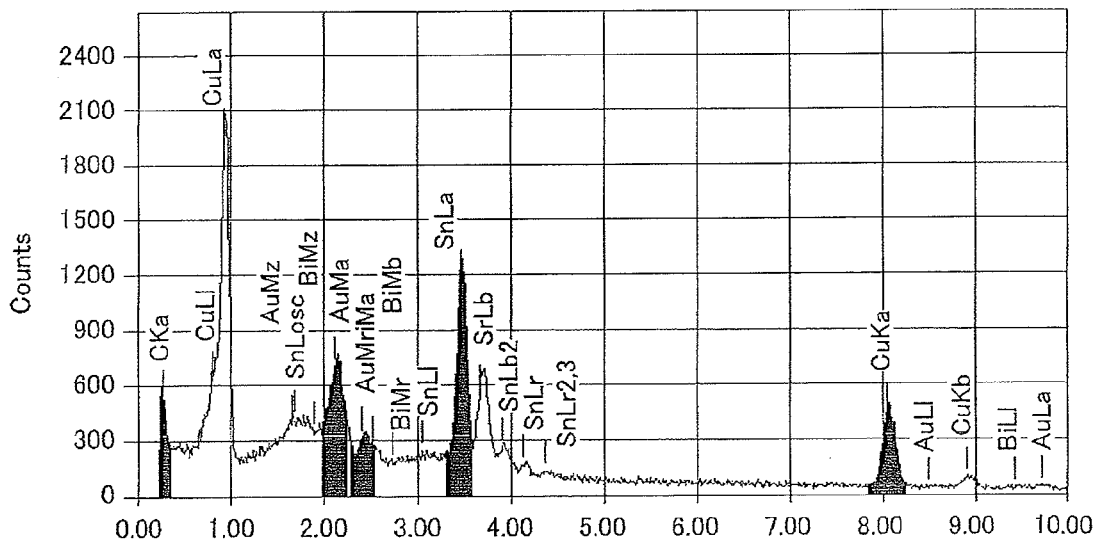
FIG. 11B shows a result of elemental analysis of a vicinity of an interface of the second conductive elements and solder.
Figure 12:
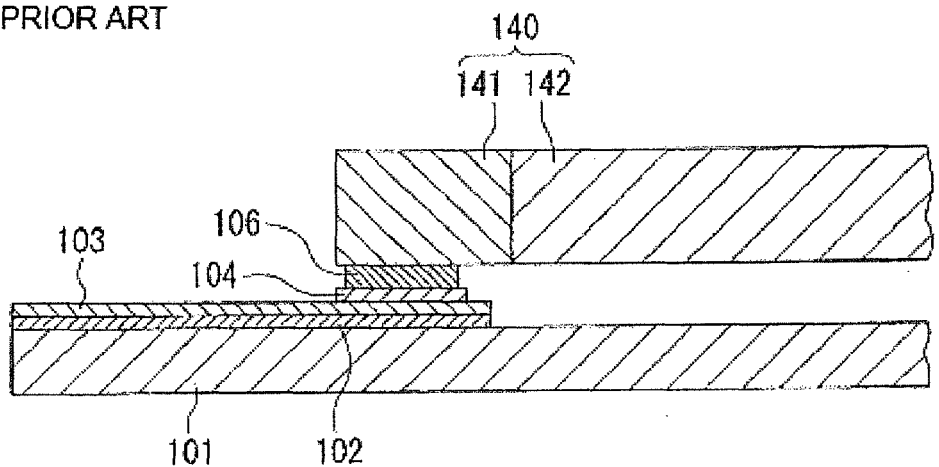
FIG. 12 is a cross-sectional view schematically showing an exemplary conventional mounting board.
Figure 13A:
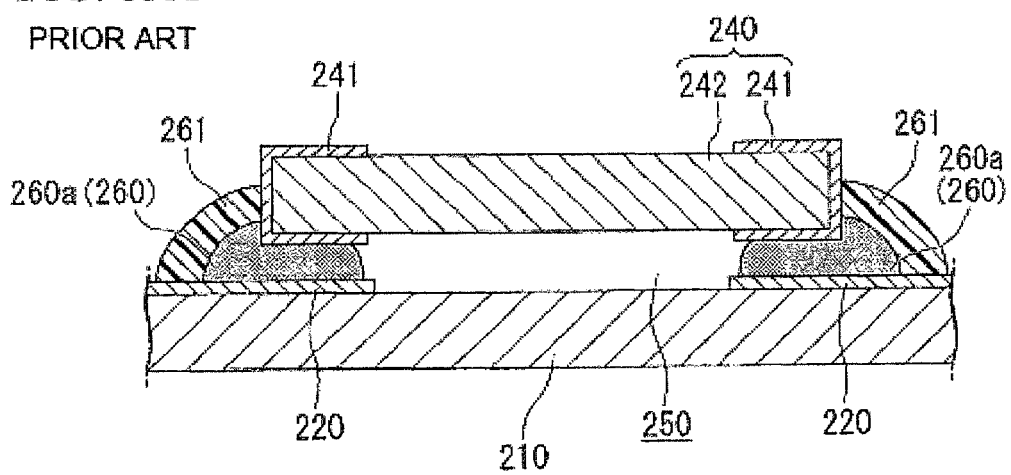
FIG. 13A is a cross-sectional view schematically showing another exemplary conventional mounting board.
Figure 13B:
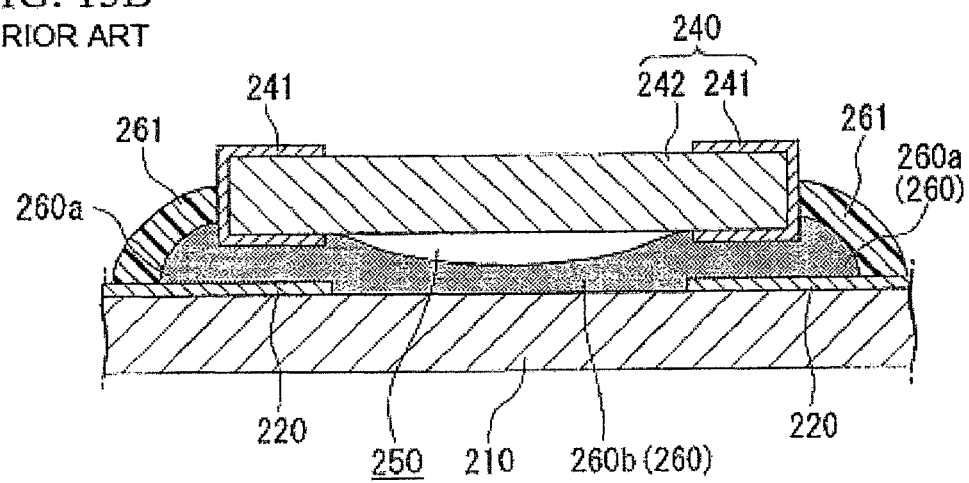
FIG. 13B is a cross-sectional view schematically showing another exemplary conventional mounting board.

In the mounting board 1 (1A to 1G) described above, the second element for forming the second conductive elements 22 further includes silver. Examples of the silver-containing second element may include silver-plated copper powder. The copper powder may be silver-plated to prevent oxidization of the copper powder, thereby improving conductivity. FIG. 10A is an image of a cross section of the mounting board according to the first embodiment of the invention photographed by using an electron microscope. The second conductive elements 22 of the mounting board are made from silver-plated copper powder. The mounting board is photographed at 2000-fold magnification. FIG. 10B is an image in which distribution of copper in FIG. 10A is detected. FIG. 10C is an image in which distribution of silver in FIG. 10A is detected. FIG. 11A shows a result of elemental analysis of the inside of second conductive elements 22 made from silver-plated copper powder. FIG. 11B shows a result of elemental analysis by using SEM-EDS of interfaces of the second conductive elements 22 made from silver-plated copper powder and the solder pieces 30.

As shown in FIGS. 10A to 10C, 11A and 11B, in case in which the second conductive elements 22 are made from silver-plated copper powder, no silver exists in the interfaces of the second conductive elements 22 and the solder pieces 30. Accordingly, even if the silver-plated copper powder is used in the second element which forms the second conductive elements 22, galvanic corrosion can be prevented from occurring between the second conductive elements 22 and the solder pieces 30. Further, oxidization of the copper powder is prevented to improve conductivity.

EXAMPLES

Production of Example 1

A piece of 100-μm-thick PET film was used as an insulative base. On the PET film, conductive paste consisting mainly of silver filler was applied by screen printing to form a circuit pattern. The film thickness of the circuit pattern was 10 μm. The conductive paste was then dried by heat and first conductive elements having lands were formed as a circuit on the insulative base.

Next, conductive paste consisting mainly of copper filler was applied by screen printing on the lands of the first conductive elements. The conductive paste was then dried by heat to form second conductive elements.

Next, Sn/Bi low-temperature solder was applied to the second conductive elements using a dispenser. The solder was applied under following conditions: nozzle diameter was 0.2 mm, air pressure was 60 kPa, discharging duration was 500 msec and distance between the nozzle and the second conductive elements was 0.1 mm.

An electronic component was mounted such that the applied Sn/Bi low-temperature solder pieces and electrode sections of the electronic component were electrically connected together. The electronic component herein was a jumper chip resistor of 1.6×0.8×0.45 mm (length×width×height) having tin-plated electrode sections. The mounting board was then heated to melt the Sn/Bi low-temperature solder pieces. In this manner, the mounting board of Example 1 was produced.

Production of Comparative Example

First conductive elements and second conductive elements were formed on the PET film in the same manner as in Example 1. A conductive adhesive was applied to the second conductive elements using a dispenser. The conductive adhesive was applied under following conditions: nozzle diameter was 0.2 mm, air pressure was 50 kPa, discharging duration was 200 msec and distance between the nozzle and the second conductive elements was 0.1 mm.

Next, an electronic component was mounted using a mounting machine such that its tin-plated electrode sections were aligned with areas to which the conductive adhesive was applied. Then, the conductive adhesive was dried and cured. The electronic component was the same as that of Example 1.

Next, thermosetting resin was applied as sealing resin using a dispenser so as to cover four sides of the mounted electronic component. The sealing resin was applied so as not to adhere to an upper surface of the electronic component.

Then, the sealing resin was cured to form a mounting board of Comparative Example.

Comparison of Example 1 and Comparative Example

Connection resistance of the mounting boards of Example 1 and Comparative Example was evaluated before and after performing a wet heat test. The results are shown in Table 1. Evaluation was carried out in the following manner.
Connection Resistance Electrical current at 1 mA was applied to the mounting boards of Example 1 and Comparative Example using a constant voltage current generator (R6142 manufacture by Advantest Corporation). The voltage applied between the electronic component and the first conductive elements (i.e., the board circuit) was measured by a using a multimeter (Model 2000 manufactured by Keithley Instruments Inc.). Resistance (i.e., connection resistance) between the electronic component and the first conductive elements was computed based on the measured voltage. The number of samples measured was 20 for each Example 1 and Comparative Example. Average values of the resistance values (Ω) obtained from Example 1 and Comparative Example are shown in Table 1.
Connection Resistance after Wet Heat Test The mounting boards of which connection resistance had been already measured were placed in a testing chamber (Keyless Chamber TH412 manufactured by Kusumoto Chemicals, Ltd.) in an atmosphere of 60° C., 95% RH, and left for 240 hours. Then, connection resistance of the mounting boards was measured again.

The number of samples measured was 20 for each Example, the same number as in the measurement of the connection resistance described above. Average values of the resistance values (Ω) obtained in Example 1 and Comparative Example are shown in Table 1.

TABLE 1

| Evaluation Items | Comparative Example | Example 1 |
| --- | --- | --- |
| Connection Resistance (Ω) | 0.309 | 0.114 |
| Connection Resistance (Ω) after Wet Heat Test | 220.237 | 0.12 |

The results in Table 1 showed that the connection resistance in Example 1 was lower than that of Comparative Example. This means that connection of the electronic component and the board circuit was stable. The connection reliability was improved.

The resistance value in the connection resistance after the wet heat test increased considerably in Comparative Example. This is because the electrode sections of the electronic component were tin-plated, which was incompatible with the conductive adhesive and thus corrosion occurred in their connection interface. In Example 1, the connection resistance after wet heat was substantially not changed.

Example 2

A mounting board shown in FIGS. 3A to 3C was produced for Example 2. A circuit (i.e., first conductive elements) was formed on PET film in the same manner as in Example 1. Film thickness of the circuit was 10 μm and a land diameter was 1.2 mm. Conductive paste consisting mainly of copper filler was applied by screen printing to lands to produce copper lands (i.e., second conductive elements). The copper lands were 30 μm in film thickness and 1.6 mm in diameter. Low-temperature solder pieces were then formed in the same manner as in Example 1, and an electronic component was mounted. In this manner, the mounting board of Example 2 was produced.

Example 3

A mounting board on which resist is provided as shown in FIG. 4B was produced for Example 3. A circuit (i.e., first conductive elements) and copper lands (i.e., second conductive elements) were formed on PET film in the same manner as in Example 2. Next, resist was applied by screen printing to the copper lands so as to cover the circuit and the copper lands except for areas where the low-temperature solder pieces were applied. The resist was then heated and dried. Film thickness of the resist was 20 μm and a diameter of the areas to which the low-temperature solder pieces were applied (i.e., areas on the copper lands to which no resist was applied) was 1.2 mm. The low-temperature solder pieces were then formed in the same manner as in Example 1, and an electronic component was mounted. In this manner, the mounting board of Example 3 was produced.

Example 4

A mounting board shown in FIGS. 6A and 6B was produced for Example 4. A circuit (i.e., first conductive elements) and copper lands (i.e., second conductive elements) were formed on PET film in the same manner as in Example 1. A diameter of the lands of the circuit was 1.6 mm and a diameter of the copper lands was 1.2 mm. Then, resist was printed by screen printing to vicinities of the lands of the circuit so as to cover the exposed circuit. A thermosetting non-conductive adhesive was applied to the copper lands except for areas to which low-temperature solder was to be applied, to the lands of the exposed circuit and to the circuit by screen printing. Film thickness of the thermosetting non-conductive adhesive was 30 μm and a diameter of the areas to which the low-temperature solder was to be applied (i.e., the areas on the copper lands to which no thermosetting non-conductive adhesive was applied) was 1.2 mm. Low-temperature solder pieces were formed in the same manner as in Example 1 and an electronic component was mounted. In this manner, the mounting board of Example 4 was produced.

Example 5

A mounting board shown in FIGS. 8A and 8B was produced for Example 5. A circuit and copper lands were formed in the same manner as in Example 4. Resist was printed by screen printing so as to cover the circuit, the lands of the circuit and the copper lands except for areas of the copper lands where the low-temperature solder was to be applied. The resist was then heated and dried. A thermosetting non-conductive adhesive was printed by screen printing onto an area below the mounting component. The low-temperature solder pieces were formed in the same manner as in Example 1, and an electronic component was mounted. In this manner, the mounting board of Example 5 was produced.

Evaluation as to connection resistance, visual inspection and occurrence of migration was carried out for the obtained mounting boards of Examples 1 to 5 and Comparative Example. The results are shown in Table 2. Evaluation was carried out in the following manner.

The evaluation method of the connection resistance is described above. The number of samples measured was 20 for each example. Average values of the resistance value (Ω) obtained in Examples 1 to 5 and Comparative Example are shown in Table 2.

Visual Inspection

Mounting sections of the electronic components were observed from behind the mounting boards of Examples 1 to 5 and Comparative Example to determine whether the conductive adhesive pieces or the solder pieces were united together. Evaluation criteria were as follows: no unification was formed: GOOD and some unification was formed: BAD. The observed number of the mounting boards is 50 for each Examples 1 to 5 and Comparative Example.

Migration

Water drops were given to the mounting boards of Examples 1 to 5 and Comparative Example in areas where the components were mounted. Electrical current at 5 mA was applied to the circuits using a constant voltage current generator (R6142 manufacture by Advantest Corporation). While the current was being applied, the space between adjacent lands was observed to determine whether or not migration occurred. The test was performed for 3 hours. The criteria were as follows: migration was observed in many mounting boards: BAD, migration was observed in several mounting boards: NOT GOOD and no migration was observed: GOOD. The number of the mounting boards observed was 50 for each Examples 1 to 5 and Comparative Example.

TABLE 2

| Evaluation Items | Comparative Example | Example 1 | Example 2 | Example 3 | Example 4 | Example 5 |
|---|---|---|---|---|---|---|
| Connection Resistance (Ω) | 0.309 | 0.114 | 0.110 | 0.110 | 0.110 | 0.110 |
| Visual Inspection (Number of defective items) | BAD (9) | GOOD | GOOD | GOOD | GOOD | GOOD |
| Migration (Number of defective items) | BAD (8) | NOT GOOD (2) | GOOD | GOOD | GOOD | GOOD |

The results in Table 2 showed that the connection resistance in Examples 1 to 5 was lower than that of Comparative Example. This means that connection of the electronic component and the board circuit was stable. The connection reliability was improved. In the visual inspection, defects due to unification of the conductive adhesive pieces were observed in Comparative Example while no defect was observed in Examples 1 to 5. This is because a solder material was used in Examples 1 to 5 and thus self alignment characteristic of the solder prevents occurrence of unification. With this configuration, even small components can be mounted without causing defects. In the observation result of migration, migration occurred in many mounting boards in Comparative Example while migration was effectively suppressed in Example 1. Especially in the mounting boards of Examples 2 to 5 in which resist or an adhesive agent was provided between the electronic component and the PET film, migration was not observed at all and it was confirmed that migration could be prevented more effectively.

Fixing strength of the electronic component was evaluated for the obtained mounting boards of Examples 1, 4, 5 and Comparative Example. The results are shown in Table 3. Evaluation was carried out in the following manner.

Fixing Strength between Components

In the mounting boards of Examples 1, 4, 5 and Comparative Example, the electronic component was pressed laterally and strength with which the electronic component separated was measured. The number of samples measured was 20 for each Examples 1, 4, 5 and Comparative Examples. Average values of the fixing strength (N) obtained in Examples 1, 4, 5 and Comparative Example are shown in Table 3.

TABLE 3

| Evaluated Items | Comparative Example | Example 1 | Example 4 | Example 5 |
|---|---|---|---|---|
| Fixing strength of component (N) | 26.0 | 24.5 | 28.0 | 28.0 |

The results in Table 3 showed that the fixing strength of the electronic component of Example 1 was equivalent to that of Comparative Example. The fixing strength of the electronic component was improved by providing the adhesive agent between the electronic component and the PET film.

From the results described above, the electronic components can be stably mounted in Examples 1 to 5 regardless of content of tin in the electrode of the electronic component or size of the electronic component. The resin provided between the electronic component and the insulative base prevented migration and improved fixing strength of the electronic component.

The invention can be applied to membrane circuit boards in various electric appliances and electronic equipment.

What is claimed is:

1. A mounting board comprising:
   an insulative base with a top surface;
   a plurality of first conductive elements provided on said top surface of the insulative base and having lands;
   a plurality of second conductive elements disposed on the lands;
   a plurality of solder pieces each disposed on each of the second conductive elements; and
   an electronic component which includes electrode sections each contacting each of the solder pieces,
   wherein the first conductive elements are made from a first element that contains at least silver; the second conductive elements are made from a second element that contains at least copper; and the solder pieces are made from a third element that contains at least tin.

2. The mounting board according to claim 1, wherein the insulative base is made from polyethylene terephthalate.

3. The mounting board according to claim 1, wherein a resin is disposed at least between the electronic component and the insulative base.

4. A mounting board comprising:
   an insulative base;
   a plurality of first conductive elements provided on the insulative base and having lands;
   a plurality of second conductive elements disposed on the lands;
   a plurality of solder pieces each disposed on each of the second conductive elements; and
   an electronic component which includes electrode sections each contacting each of the solder pieces,
   wherein the first conductive elements are made from a first element that contains at least silver; the second conductive elements are made from a second element that contains at least copper; and the solder pieces are made from a third element that contains at least tin; and,
   wherein the second element further contains silver.

5. A mounting board comprising:
   an insulative base;
   a plurality of first conductive elements provided on the insulative base and having lands;
   a plurality of second conductive elements disposed on the lands;
   a plurality of solder pieces each disposed on each of the second conductive elements; and
   an electronic component which includes electrode sections each contacting each of the solder pieces,
   wherein the first conductive elements are made from a first element that contains at least silver; the second conductive elements are made from a second element that contains at least copper; and the solder pieces are made from a third element that contains at least tin; and,
   wherein the lands are larger than the second conductive elements.

6. A method of producing a mounting board which includes: an insulative base with a top surface; a plurality of first conductive elements provided on said top surface of the insulative base and having lands; a plurality of second conductive elements disposed on the lands; a plurality of solder pieces each disposed on each of the second conductive elements; and an electronic component which includes electrode sections each contacting each of the solder pieces, wherein the first conductive elements are made from a first element that contains at least silver; the second conductive elements are made from a second element that contains at least copper; and the solder pieces are made from a third element that contains at least tin, the method comprising:
   forming the first conductive elements and the second conductive elements on the top surface of the insulative base;
   forming the solder pieces on the second conductive elements; and
   mounting the electronic component with each of the electrode sections contacting with each of the solder pieces.

7. The method of producing the mounting board according to claim 6, further comprising providing resin between the electronic component and the insulative base and filling at least between the electronic component and the insulative base with the resin.

* * * * *